United States Patent [19]

Fuchs et al.

[11] Patent Number: 4,694,278

[45] Date of Patent: Sep. 15, 1987

[54] INTEGRABLE DECODING CIRCUIT

[75] Inventors: Hans P. Fuchs, Munich; Jürgen R. Goetz, Oberneuching, both of Fed. Rep. of Germany

[73] Assignee: Siemens Aktiengesellschaft, Berlin and Munich, Fed. Rep. of Germany

[21] Appl. No.: 908,829

[22] Filed: Sep. 18, 1986

[30] Foreign Application Priority Data

Sep. 20, 1985 [DE] Fed. Rep. of Germany ....... 3533606

[51] Int. Cl.$^4$ ............................................. H03M 7/00
[52] U.S. Cl. .............................. 340/347 DD; 307/463
[58] Field of Search ............... 307/449, 451, 452, 463, 307/468, 469, 481, 496; 340/347 DD, 825.02; 365/230

[56] References Cited

U.S. PATENT DOCUMENTS

| | | |
|---|---|---|
| 3,397,325 | 8/1963 | Weimer . |
| 3,539,823 | 11/1970 | Zuk . |
| 4,145,622 | 3/1979 | Hofmann et al. . |
| 4,176,287 | 11/1979 | Remedi . |
| 4,499,388 | 2/1985 | Adam . |

FOREIGN PATENT DOCUMENTS

| | | |
|---|---|---|
| 0061513 | 10/1982 | European Pat. Off. . |
| 2641693 | 3/1978 | Fed. Rep. of Germany . |
| 2144563 | 3/1985 | United Kingdom . |

OTHER PUBLICATIONS

IBM Technical Disclosure Bulletin, vol. 15, No. 9, Feb. 1973, New York, U.S.; R. Kenyon et al.: "Complementary Field Effect Transistor High-Density Decoder", p. 2823, Figure, Line 1–p. 2824, Line 12.

*Primary Examiner*—William M. Shoop, Jr.
*Assistant Examiner*—Richard K. Blum
*Attorney, Agent, or Firm*—Herbert L. Lerner; Laurence A. Greenberg

[57] ABSTRACT

A decoding circuit for decoding information represented by input signals includes: sources of transistors of one channel type in each of four CMOS inverters connected to a first supply potential; sources of transistors of another channel type in each two inverters connected to each other and to one or the other of first connecting points; two first switching transistors of the other channel type each having a drain connected to a first connecting point and a source connected to each other and to a last connecting point; the gates of each of the two first switching transistors being connected to a second input signal or a signal complementary thereto of four further input signals complementary to each other in pairs; a last switching transistor of the other channel type having a drain connected to the last connecting point, a source connected to a second supply potential and a gate connected to an input for an individual input signal; the gates of both transistors of two of the inverters being connected to a first input signal and the gates of both transistors of two of the inverters being connected to an input signal complementary to the first input signal; and further complementary transistors of the one channel type each having a drain connected to one of the connecting points, a source connected to the first supply potential and a gate connected to the gate of the switching transistor connected to the same connecting point.

7 Claims, 4 Drawing Figures

INTEGRABLE DECODING CIRCUIT

The invention relates to an integrable decoding circuit for decoding information represented by input signals. For instance, if the information represented involves addresses of a semiconductor memory, a decoding circuit according to this type is also called an address decoder. However, the information represented may also involve data an associative memory which on one hand serve for determining addresses and on the other hand form a component of the data which are to be stored or to be read out. For instance, it may furthermore involve information which determines which parts of a machine or a system (as a function of this information) are and which are not to be operated, or which determine how such machine parts or the system are to be operated. The possible applications for a decoding circuit according to this type are therefore quite varied.

In integrated semiconductor memories, for instance, a decoding circuit of the type under discussion is used for each word line and is called an address decoder. For instance, if such a semiconductor memory has $2^p$ word lines, $2^p$ address decoders are required which are all addressed in parallel by p input signals or signals complementary thereto. The same applies to the bit lines unless these are connected together to form half or entire words as far as the addresses are concerned.

German Published, Prosecuted Application No. DE-AS 26 41 693, discloses a decoding circuit of the type under discussion which is divided into a decoding circuit and an output stage. The decoding proper takes places in the decoding circuit. The decoding circuit includes a load transistor which is connected between the supply voltage and the output of the decoding circuit. It also includes p parallel-connected transistors which are connected between the output of a decoding circuit and a further supply potential which commonly represents the reference voltage (ground). A clock signal is connected to a gate of the load transistor. One of the p different input signals (address signals) or one of the address signals complementary thereto are always present at the gates of the p parallel-connected transistors. In operation, the decoding circuit outputs of all of the address decoders are first charged to the supply voltage in each storing cycle through the load transistors controlled by the clock signal, and optionally decreased by their threshold voltage.

The address signals of the address decoder which is to be selected, all subsequently have a level corresponding to the reference voltage (logical "0"). Therefore, the decoding circuit output of the selected address decoder continues to float at its previously charged potential. However, because of the leakage currents occurring there, this condition can only be maintained for a limited time. In all other address decoders, at least one of the applied address signals assumes the level corresponding to the supply voltage (logical "1"), so that the associated decoding circuit output is discharged to the reference voltage.

In summary, the following can therefore be stated regarding the prior art address decoder: All p address signals (or the signals complementary thereto) are connected to every individual address decoder. This results in an enormous length of the line for the address signals with all of the disadvantages resulting therefrom, such as an immense capacitive load, which then leads to the requirement to construct address buffers and drivers preceding the address decoders so as to be particularly large and effective and to lay them out in a special manner for high peak currents (all of the address signals are switched simultaneously). Due to the fact that in every storage cycle, the outputs of all $2^p$ address decoders are charged to the supply voltage, and due to the fact that subsequently all decoding circuit outputs are discharged again to the reference voltage with the exception of that of a selected address decoder, an enormous amount of current and therefore power is consumed, the current again being assumed to be the peak current. If the memory cycle time is to be shortened (shortening of the memory access time), the above-mentioned current consumption increases exponentially with the shortening.

It is accordingly an object of the invention to provide an integrable decoding circuit which overcomes the hereinafore-mentioned disadvantages of the heretofore-known devices of this general type, which consumes less current and in particular less peak current, which requires shorter line lengths for the input signals (as referred to all required decoding circuits of a functional unit, for instance a semiconductor memory), and in which the decoder outputs are never kept at a floating potential as described above but which are always kept in a targeted manner at one of the supply potentials, possibly changed by the amount of a transistor threshold voltage.

Although the invention is illustrated and described herein as embodied in an integrable decoder cicuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
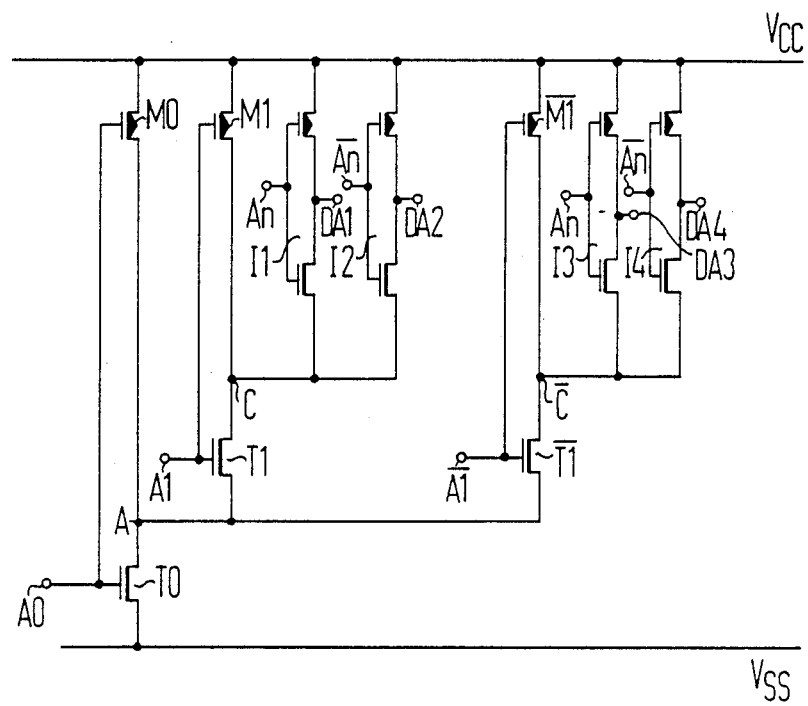
FIG. 1 is a schematic circuit diagram of an embodiment of the invention.

Referring now to the figures of the drawings in detail and first, particularly, to FIG. 1 thereof, there is seen a first embodiment of the decoding circuit according to the invention. The decoding circuit includes inputs for an individual input signal A0 and for four further input signals A1, An, $\overline{A1}$, $\overline{An}$, which are complementary to each other in pairs, as well as outputs for four decoder outputs DA1 to DA4. According to the invention, the entire decoding circuit is constructed in CMOS technology. This has many advantages over the conventional technologies, such as n-channel technology, for instance, since among other things current consumption is reduced by factors and clock signals and generators for generating the same are eliminated. CMOS technology is aso available particularly for decoding circuits in semiconductor memories, since many types of modern semiconductor memories such as 1-Mbit-DRAMs, for instance, were basically developed and manufactured in CMOS technology.

The advantageous decoding circuit according to FIG. 1 also contains four conventional CMOS inverters I1 to I4, the outputs of which each simultaneously form a decoder output DA1 to DA4. In each CMOS inverter I1 to I4, the source of the transistor of one channel-type is connected to a first supply potential VCC. This supply potential VCC may be 5 V, for instance, which in the case of CMOS technology represents a typical value. In each two of the four CMOS inverters I1 to I4, for instance in the inverters I1 and I2 on one hand and in the inverters I3 and I4 on the other hand, the source terminals of the transistors of the other channel-type are connected to each other. They thus each form a respective first connecting point C, $\overline{C}$. Therefore, two first connecting points C and $\overline{C}$ are generated overall.

The drain of a respective first switching transistor T1 or $\overline{T1}$ of the other channel-type is connected to each first connecting point C, $\overline{C}$. Thus, according to FIG. 1, the decoding circuit according to the invention contains a total of two first switching transistors T1 and $\overline{T1}$. The source terminals of the first switching transistors are again connected to each other and form a last connecting point A.

The drain of a last switching transistor T0 of the other type is connected to the last connecting point A. The source of the last switching transistor T0 is connected to a second supply potential VSS and the gate thereof is connected to the input for the individual input signals A0. The second supply potential VSS can typically be the customary reference potential.

For each first connecting point C, $\overline{C}$, the gates of both transistors of one of the two CMOS inverters, namely the inverters I1 and I3, are connected to the input for the first input signal An of the four further input signals A1, An, $\overline{A1}$, $\overline{An}$, which are complementary to each other in pairs. Similarly, for each first connecting point C, $\overline{C}$, the gates of both transistors of the other of the two CMOS inverters, namely the inverters I2 and I4 are connected to the input for the input signal $\overline{An}$, complementary to the input signal An. Therefore, in operation either the transistors of one channel type or those of the other channel type are simultaneously connected through at the inverters I1 and I3, depending the state of the first further input signal An which is connected. A corresponding behavior is exhibited by the inverters I2 and I4 where their switching behavior overall is simultaneously complementary because the input signal $\overline{An}$ complementary to the first further input signal is complementary to that of the inverters I1 and I3.

The gate of one first switching transistor T1 of the two first switching transistors T1, $\overline{T1}$ that are connected to the last connecting point A is connected to an input for a second signal A1 of the four further complementary input signals A1, An, $\overline{A1}$, $\overline{An}$, which are complementary to each other in pairs. Similarly, the gate of the other first switching transistor $\overline{T1}$ of the two first switching transistors T1, $\overline{T1}$ that are connected to the last connecting point A is connected to the input for the input signal $\overline{A1}$ complementary to the second signal A1 of the four further input signals A1, An, $\overline{A1}$, $\overline{An}$ complementary to each other in pairs.

The drain of a complementary transistor M0, M1, $\overline{M1}$ of the one channel type is furthermore connected to each of the connecting points A, C, $\overline{C}$. The source of each complementary transistor M0, M1, $\overline{M1}$ is connected to the first supply potential VCC. The gate of each complementary transistor M0, M1, $\overline{M1}$ is connected to the gate of the switching transistor T0, T1, $\overline{T1}$, which has the drain thereof connected to the same respective connecting point A, C, $\overline{C}$ as the drain of the complementary transistor Mo, M1, $\overline{M1}$ itself.

Figure 2:
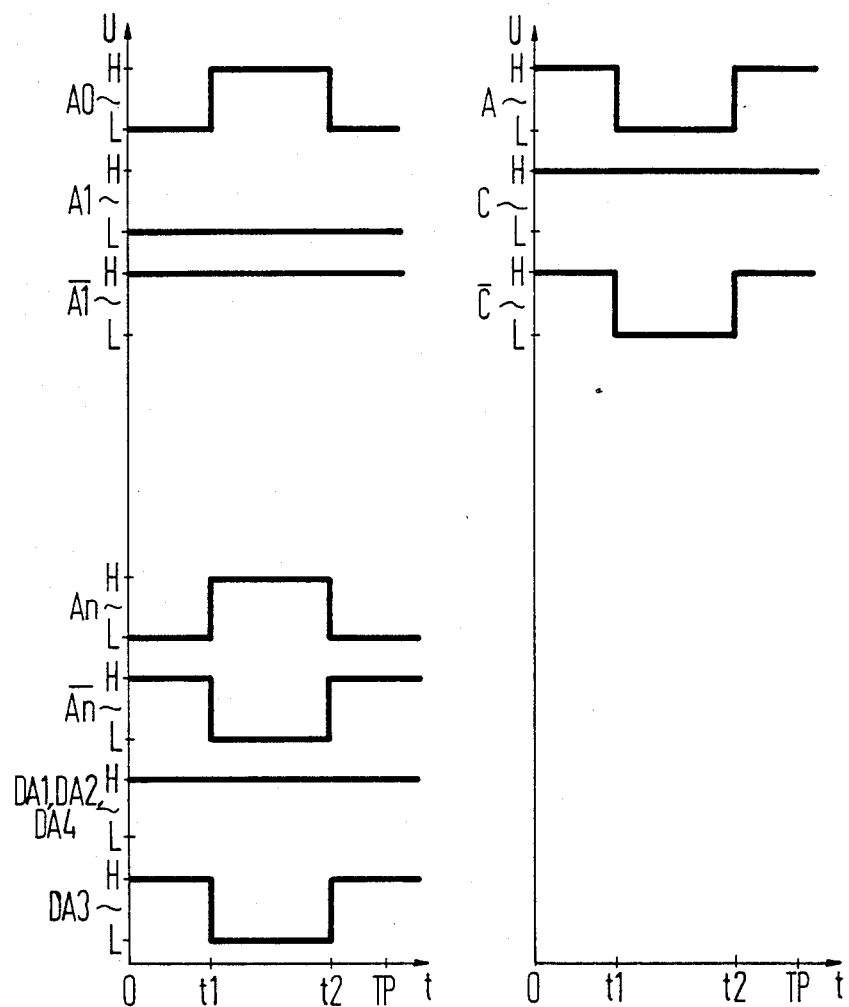
FIGS. 2 and 4 show timing diagrams associated with the embodiments of FIGS. 1 and 3.

The operation of the circuit according to FIG. 1 in connection with the corresponding timing diagram according to FIG. 2 is explained below referring to the following limiting or boundary conditions: The first supply potential VCC is 5 V. The second supply potential VSS is 0 V (ground). The input signals A0, A1, An, $\overline{A1}$, $\overline{An}$ also have approximately 5 V as the first level H and approximately 0 V as the second level L. Corresponding levels are also assumed by the decoder outputs DA1 to DA4. The above-mentioned values only serve as an example. Other values are conceivable in CMOS technology as is well known. It will furthermore be assumed that within a clock period TP under consideration and beginning at a first point in time t1, the individual input signal A0 and the first input signal An of the four further input signals A1, An, $\overline{A1}$, $\overline{An}$ which are complementary to each other in pairs have the first logic level H and the second signal A1 of the four further input signals A1, An, $\overline{A1}$, $\overline{An}$, have the second logic level L. Accordingly, beginning from the point in time t1, the input signal $\overline{An}$ of the four further input signals A1, An, $\overline{A1}$, $\overline{An}$ which is complementary to the first signal An has the second logic level L and the input signal $\overline{A1}$ of the four further input signals A1, An, $\overline{A1}$, $\overline{An}$ complementary to the second signal An has the first logic level H.

Under the above-mentioned boundary conditions, the individual input signal A0, the first signal An and the second signal A1 of the four further input signals A1, An, $\overline{A1}$, $\overline{An}$ which are complementary to each other in pairs have the second logic level L from the beginning of the clock period TP up to the point in time t1. Similarly, the input signals $\overline{An}$, $\overline{A1}$ which are complementary to the first and second signals An, A1 of the four further input signals have the first logic level H from the beginning of the clock period TP to the point in time t1. Due to this combination of the input signals A0, A1, An, $\overline{A1}$ and $\overline{An}$ in the time span from the beginning of the clock period TP to the time t1 having the first logic level t1, all decoder outputs DA1 to DA4 have the first logic level H.

The decoder outputs DA1 and DA3 are therefore at the first logic level H because the transistor belonging to the respective CMOS inverter I1, I3 of the one channel type is connected through to the first supply potential VCC. The decoder output DA2 is at the first logic level H because the transistor of the other channel type belonging to the respective CMOS inverter I2 is switched through to the first connecting point C. The connecting point C has the first logic level H because the associated complementary transistor M1 is connected through. Correspondingly, the decoder output DA4 has the first logic level H because on one hand, the transistor of the other channel type belonging to the corresponding CMOS inverter I4 is connected through to the first connecting point $\overline{C}$ and on the other hand, the first switching transistor $\overline{T1}$ is connected through to the last connecting point A. The connecting point A has the first logic level H because the complementary transistor M0 is connected through.

Beginning at the point in time t1, the input signals A0, A1, An, $\overline{A1}$, $\overline{An}$ assume the logic level which corresponds to the information (typically, this is address information) which they are to represent. In the illustrated embodiment, the individual input signal A0, the first further input signal An and the input signal $\overline{A1}$ complementary to the second further input signal A1 assume the first logic level H or retain this level. Similarly, the input signal $\overline{An}$ complementary to the first further input signal An and the second further input signal A1 assume the second logic level L or retain it. The last connecting point A therefore assumes the second logic level L since the last switching transistor T0 is switched into conduction and the keep-up transistor M0 associated with it is cut off. The second logic level L therefore is present at the source terminals of the first switching transistors T1, $\overline{T1}$.

The first switching transistor T1 is cut off, but the associated complementary transistor M1 conducts. Similarly, the first connecting point C has the first logic level H. Since the transistor of the other channel type conducts in the first CMOS inverter I1, the first logic level H of the first connecting point $\overline{C}$ is connected through by this transistor to the first decoder output DA1. At the second decoder output DA2, the transistor of the one channel type conducts at the corresponding CMOS inverter I2; the second decoder output DA2 also has the first logic level H.

The first switching transistor $\overline{T1}$ is connected through, and its associated complementary transistor $\overline{M1}$ is cut off.

Therefore, the second logic level L is present at the first connecting point $\overline{C}$. Since the transistor of the other type is conducting in the third CMOS inverter I3 associated with the third decoder output DA3, the logic level L present at the first connecting point $\overline{C}$ is connected through to the decoder output DA3. The output DA3 is therefore selected.

The fourth decoder output DA4 remains at the first logic level H through the transistor of the one channel type of the associated fourth CMOS inverter I4 which is connected through.

Beginning at a later point in time t2, the input signals A0, A1, An, $\overline{A1, An}$ again assume the levels which they originally had from the beginning of the clock period TP to the first point in time t1. As a result, the decoder outputs DA1 to DA4 assume the first logic level H as already described for the time period up to the first point in time t1 or they retain it.

With the output signal occurring at the selected decoder output DA3, another following decoder circuit can be connected at the input, for instance, independently of whether the other decoder is constructed according to the invention or in accordance with the state of the art. Then, the decoder circuit according to the invention acts like a predecoder. Each decoder output DA1 to DA4 therefore indirectly addresses a group of word or bit lines if the decoding circuit according to the invention is integrated in a semiconductor memory. However, the output signal can also be fed directly to another circuit or control line to be controlled, for instance a word line or a bit line in the case of a semiconductor memory.

A decoding circuit constructed in this manner avoids all of the previously mentioned disadvantages according to the state of the art. Besides a minimized current consumption, the decoding circuit according to the invention is characterized by potential states which are clearly defined at any time at the connecting points A, C, $\overline{C}$ and therefore also at the decoder outputs DA1 to DA4. If the device according to the invention is used in a semiconductor memory as a predecoder in the manner described above, the decoder outputs DA1 to DA4 can first be addressed by word or bit lines which can be addressed individually by decoders following the decoding circuit according to the invention in connection with other further address lines. In this case, the following decoders can be constructed according to the invention or according to the state of the art. In this manner, a great deal of space can be saved, among other things, when constructing a decoder circuit according to the invention, especially for integration into an integrated semiconductor circuit, as compared to a construction according to the state of the art.

As described above with the aid of FIGS. 1 and 2, the idea behind the invention can be applied so generally that it can be applied not only to a total of five input signals A0, A1, An, $\overline{A1, An}$ and four decoder outputs DA1 to DA4, but quite generally to decoding circuits with $2n+1$ input signals A0 ... and $2^n$ decoder outputs DA1 .... The decoding circuit according to the invention will be described below with the aid of FIGS. 3 and 4 for $n=3$ as a further possible embodiment. The necessary circuit measures for $n>3$ are likewise described but not shown graphically for reasons of clarity. The circuit according to invention according to FIG. 3 is built onto the embodiment according to FIG. 1.

As compared with the embodiment according to FIG. 1 described above (with $n=2$), the second embodiment of the decoding circuit according to the invention has inputs for further $2(n-2)$ input signals which are complementary to each other in pairs. As seen in FIG. 3, two further mutually complementary input signals A2 and $\overline{A2}$ for $n=3$ are therefore obtained. The FIG. 3 device furthermore has $2^{n-1}$ other decoder outputs for four other $n=3$ decoder outputs DA5 to DA8. These are simultaneously outputs for $2^{n-1}$ further CMOS inverters, for instance I5 to I8.

Similar to the embodiment according to FIG. 1, the source terminals of the transistors of the other channel type for each two inverters I5 and I6 as well as I7 and I8 of the further CMOS inverters I5 to I8, are connected to each other. They each form a respective further first connecting point D or $\overline{D}$. Overall, a total of $2^{n-1}$ first connecting points C, D, $\overline{C}$, $\overline{D}$ are generated. The further CMOS inverters I5 to I8 are otherwise wired exactly like the first four CMOS inverters I1 to I4, i.e. in particular, the gates of the transistors thereof are alternately connected from CMOS inverter to CMOS inverter, to the inputs for the first further input signal An and the input signal $\overline{An}$ complementary thereto.

Figure 3:
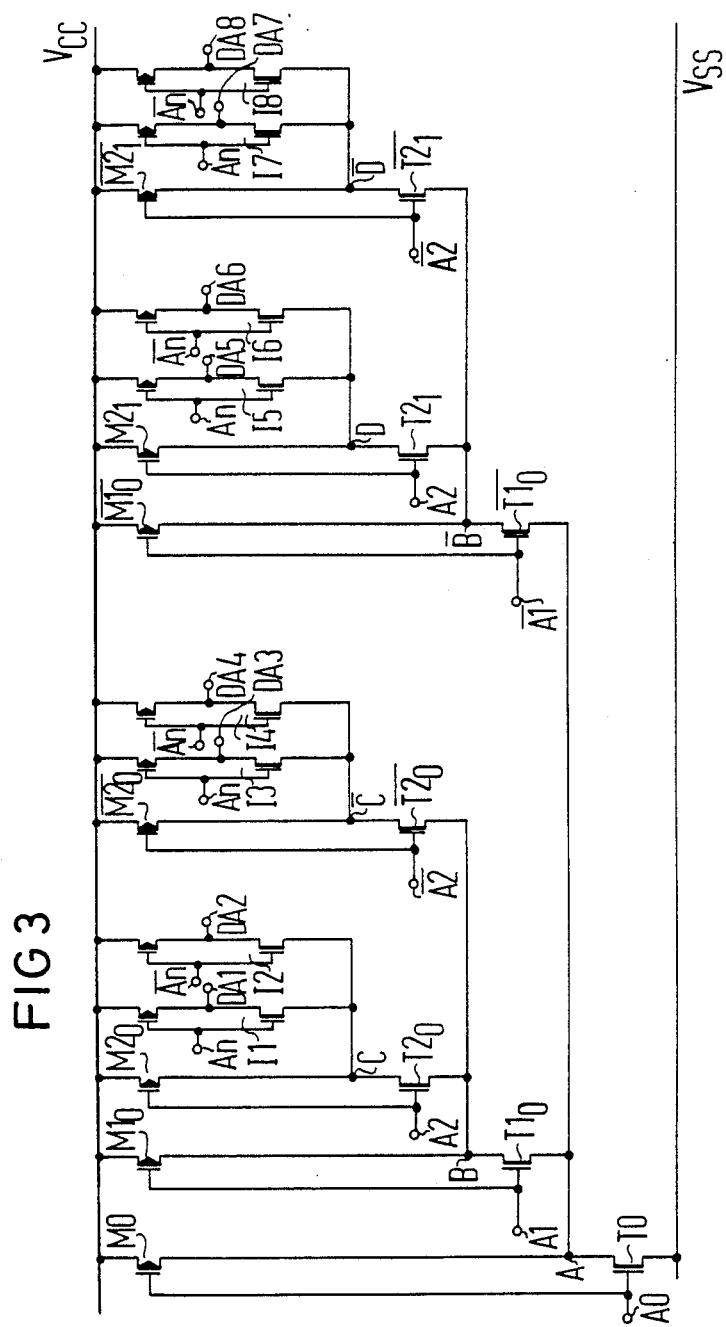
FIG. 3 is a circuit diagram of another embodiment according to the invention.

Furthermore, deviating from the embodiment according to FIG. 1, in the circuit according to the invention shown in FIG. 3, the drain of a first switching transistor $T2_0$, $T2_1$, $\overline{T2_0}$, $\overline{T2_1}$ of the other channel type is connected to each of the first connecting points C, D, $\overline{C}$, $\overline{D}$. The source terminals of each two first switching transistors, namely $T2_0$ and $\overline{T2_0}$, as well as $T2_1$ and $\overline{T2_1}$ are tied together to form a second connecting point B or $\overline{B}$. A total of $2^{n-1}$ second connecting points B, $\overline{B}$ are therefore formed.

For $n> = 3$, the drain of a second switching transistor $T1_0$, $\overline{T1_0}$ of the other channel type is connected to each of the second connecting points B, $\overline{B}$. This connection of second switching transistors to the second connecting points B, $\overline{B}$ is therefore accomplished in the same manner as the above-described connection of the drains of the first switching transistors to the first connecting points. Accordingly, the source terminals of each two of the second switching transistors $T1_0$, $\overline{T1_0}$ are also connected to each other, thereby forming a further connecting point. Thus, a total of $2^{n-3}$ further connecting points are formed. For $n>=3$, this alignment of switching transistors, combining the source terminals of each two switching transistors, is accomplished in accordance with the invention in a hierarchical manner (for instance from the top down in FIG. 3) from the first connecting points C, D, $\overline{C}$, $\overline{D}$, as counted in hierarchial steps, in $n-1$ switching stages. Therefore, the last connecting point A is formed at the end of this alignment as the last of the further connecting points. Thus, a total of n-1 switching stages are also formed between the first connecting points C, D, $\overline{C}$, $\overline{D}$, as counted through the second connecting points B, $\overline{B}$ and the further connecting points to the last connecting point A.

Gate-wise, the first ($T2_0$, $T2_1$, $\overline{T2_0}$, $\overline{T2_1}$), the second ($T1_0$, $\overline{T1_0}$) and the further switching transistors are connected as follows: in the case of each of the second connecting points B and $\overline{B}$, the gate of a respective one of the two first switching transistors, namely $T2_0$ and $T2_1$, connected to the second connecting point B and $\overline{B}$, is connected to an input for a first signal A2 of the $2(n-2)$ further input signals A2, $\overline{A2}$ complementary to each other in pairs. Similarly, the gates of the other of the two first switching transistors, namely $\overline{T2_0}$ and $\overline{T2_1}$ connected to the second connecting point $\underline{B}$ or $\overline{B}$ are connected to the input for the input signal $\overline{A2}$ complementary to the first signal A2 of the $2(n-2)$ further input signals A2, $\overline{A2}$ complementary to each other in pairs.

In addition, for $n>3$, for each of the further connecting points, in each switching stage with further switching transistors, except for the switching stage with the last switching transistor A, on one hand, the gate of one of the two further switching transistors which is connected to the respective further connecting point is connected to a further one of the $2(n-2)$ further input signals complementary to each other in pairs and on the other hand, the gate of the other of the two further switching transistors which is connected to the further connecting point is connected to the input signal complementary to the further one of the $2(n-2)$ further input signals complementary to each in pairs.

Correspondingly and analogously to the embodiment according to FIG. 1, in the switching stage according to FIG. 3 with the last switching transistor A, the gate of one transistor $T1_0$ of the two second switching transistors $T1_0$, $\overline{T1_0}$ is connected to the input for the second signal A1 of the four further input signals A1, An, $\overline{A1}$, $\overline{An}$ complementary to each other in pairs and the gate of the other transistor $\overline{T1_0}$ of the second switching transistors $T1_0$, $\overline{T1_0}$ is connected to the input for the input signal $\overline{A1}$ complementary to the second signal A1 of the four further input signals A1, An, $\overline{A1}$, $\overline{An}$ complementary to each other in pairs.

According to the general principle of the invention, especially according to the embodiment illustrated in FIG. 3, the drain of a complementary transistor $M2_0$, $M2_1$, $\overline{M2_0}$, $\overline{M2_1}$, $M1_0$, $\overline{M1_0}$ of the one channel type is connected to each of the first connecting points C, D, $\overline{C}$, $\overline{D}$ and to each of the second connecting points B, $\overline{B}$ and further connecting points except the switching transistors. The sources of each of the complementary transistors $M2_0$, $M2_1$, $\overline{M2_0}$, $\overline{M2_1}$, $M1_0$, $\overline{M1_0}$ are each connected to the first supply potential VCC. Each gate of the complementary transistors is connected to the gate of the respective switching transistor $T1_0$, $\overline{T1_0}$, $T2_0$, $T2_1$, $\overline{T2_0}$, $\overline{T2_1}$ having the drain thereof connected to the respective connecting point and therefore to the drain of the complementary transistor $M1_0$, $M1_0$, $\overline{M2_0}$, $M2_1$, $\overline{M2_0}$, $\overline{M2_1}$ connected thereto.

Figure 4:
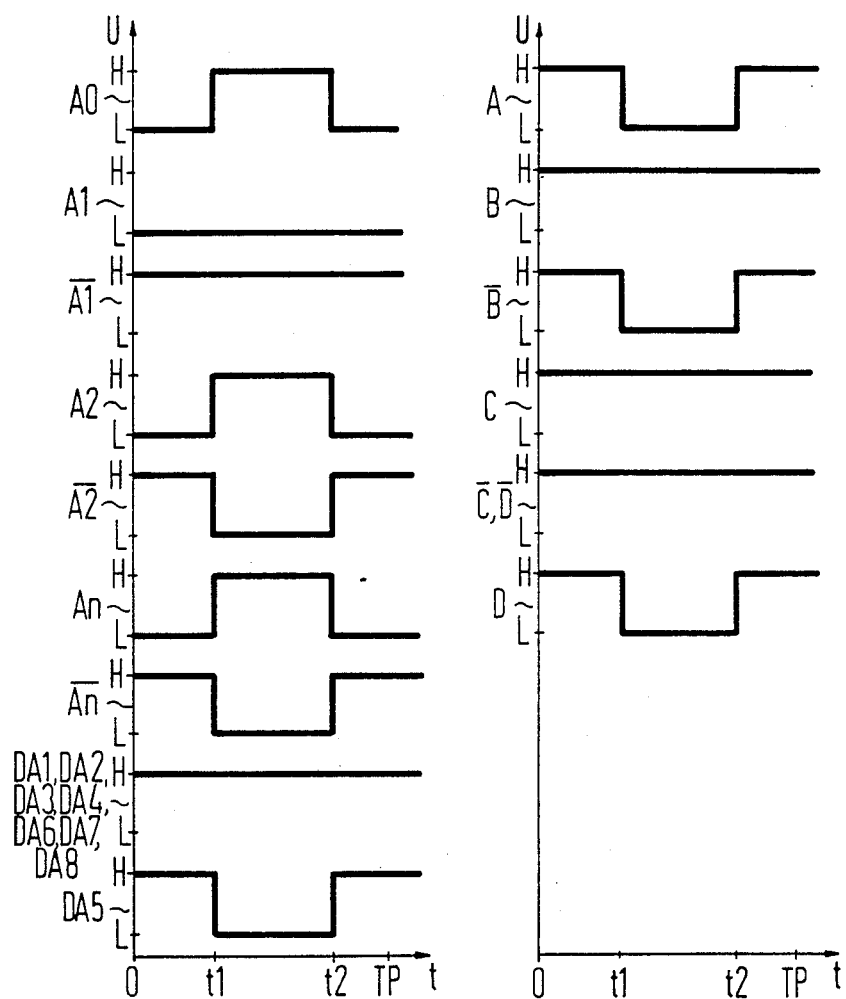

The operation of the circuit according to FIG. 3 can be explained, for instance, by means of the timing diagram according to FIG. 4 as follows: The input signals A0, A1, An, $\overline{A1}$, and $\overline{An}$ have the same waveform within the entire clock period TP as in the circuit according to FIG. 1 and the timing diagram according to FIG. 2. The further input signal A2 is assumed to have the second logic level L from the beginning of the clock period TP to the first point in time t1 and the further input signal $\overline{A2}$ complementary thereto has the first logic level H. From the first point in time t1 to the later point in time t2, the further input signal A2 is assumed to have the first logic level H and the input signal A2 complementary thereto is assumed to have the second logic level L.

From the beginning of the clock period TP to the first point in time t1, all of the decoder outputs DA1 to DA8 have the first logic level H because on one hand, the individual input signal A0, the further input signals A1 and An as well as the input signal A2 of the $2(n-2)$ further input signals have the second logic level L and on the other hand, the input signals $\overline{A1}$, $\overline{A2}$, $\overline{An}$ complementary to the further signals A1, A2, An have the first logic level H. Therefore, all of the connecting points A, B, C, D, $\overline{B}$, $\overline{C}$, $\overline{D}$ and therefore also all of the decoder outputs DA1 to DA8 are at the first logic level H.

From the first point in time t1, the individual input signal A0 and the further input signal A1 change their logic level as already described, as well as the input signal $\overline{An}$ complementary thereto. In addition, the signal of the $2(n-1)$ further input signals designated as the signal A2, assumes the first logic level H. Similarly, the input signal $\overline{A2}$ complementary thereto assumes the second logic level L.

Consequently, the last connecting point A in the period between t1 and t2 has the second logic level L (the last switching transistor T0 is switched into conduction).

The connecting point B of the two second connecting points B, $\overline{B}$ is placed at the first logic level H through the complementary transistor $M_0$ associated therewith, since the further input signal A1 which controls the complementary transistor $M1_0$ and the transistor $T1_0$ of the two second switching transistors $T1_0$, $\overline{T1_0}$ has the second logic level L. Correspondingly, the other connecting point $\overline{B}$ of the two second connecting points B, $\overline{B}$ is placed at the logic level which is present at the last connecting point A through the other transistor $\overline{T1_0}$ of the two second switching transistors $T1_0$, $\overline{T1_0}$, i.e. at the second logic level L. This is because the other transistor $\overline{T1_0}$ of the two switching transistors $T1_0$, $\overline{T1_0}$ becomes conducting and the corresponding complementary transistor is cut off through the input signal $\overline{A1}$ complementary to the above-mentioned further input signal A1.

The input signal A2 of the $2(n-2)$ further input signals A2, $\overline{A2}$, switch the first switching transistors $T2_0$, $T2_1$ into conduction. Therefore, the first connecting points C, D assume the logic levels which the two second connecting points B, $\overline{B}$ have. The first connecting C therefore is at the first logic level H and the first connecting point D is set at the second logic level L.

At the same time, the input signal $\overline{A2}$ complementary to the input signal A2 of the $2(n-2)$ further input signals A2, $\overline{A2}$ cuts off the first switching transistors $\overline{T2_0}$ and $\overline{T2_1}$ which it controls. Similarly, this complementary input signal $\overline{A2}$ switches the complementary transistors $\overline{M2}_0$ and $\overline{M2}_1$ associated with the first switching transistors $\overline{T2}_0$ and $\overline{T2}_1$ into conduction. The first connecting points $\overline{C}$ and $\overline{D}$ therefore have the first logic level H.

Since the first connecting points C, $\overline{C}$ and $\overline{D}$ have the first logic level H, the decoder outputs DA1 to DA4, DA7 and DA8 can only have the first logic level H, independently of the logic level of the input signals An and $\overline{An}$ of the CMOS inverters I1 to I4, I7 and I8.

The decoder output DA6 also remains at the first logic level H, since the input signal $\overline{An}$ present at the corresponding CMOS inverter I6 switches the transistor of the one channel type into conduction within the CMOS inverter I6. Therefore, the first supply potential VCC receives the decoder output DA6 as the first logic level H.

However, the further input signal An present at the CMOS inverter I5, switches the transistor of the other channel type into conduction within the CMOS inverter I5, so that the second logic level L present at the first connecting point D switches through to the decoder output DA5. Therefore, by means of the information selected in the example, the decoder output DA5 is chosen unequivocally, stably and exclusively, as a combination of input signal values, while the remaining decoder outputs DA1 to DA5 and DA6 to DA8 remain unselected.

From the later point in time t2 to the end of the clock period TP, all of the input signals again have their original value which they had from the beginning of the clock period TP to the first point in time t1.

It is also part of the invention to designate the transistors of the one channel type as p-channel transistors, especially of the enhancement type: that the transistors of the other channel type are n-channel transistors, especially of the enhancement type: and that the first supply potential VCC is a more positive potential than the second supply potential VSS.

Similarly, a reverse assignment is also possible, in which the transistors of the one channel type are n-channel transistors; those of the other channel type are p-channel transistors and the first supply potential VCC is a potential more negative than the second supply potential VSS. Advantageously, these transistors are also of the enhancement type.

Advantageously, a first group of signals A0, A1, A2, An of the total input signals A0, A1, A2, An, $\overline{A1}$, $\overline{A2}$, $\overline{An}$ has a value as the logic level which is substantially equal to the second supply potential VSS, from the beginning of the clock period TP to the first point in time t1 (inactivated state). The remaining input signals A1, A2, An which, of course, are complementary to the corresponding input signals of the first group (A0, A1, A2, An) have a logic level in this interval which is substantially equal to the first supply potential VCC.

A substantial difference between a decoding circuit according to the state of the art and the embodiments of the decoding circuit according to the invention described above, is as follows. In the state of the art, in the unselected state, a selected decoder output retains the first logic level H and is connected through to the second logic level L. However, in the embodiments of the invention described above, the selected decoder output has the second logic level L and all other unselected decoder outputs have the first logic level H. This has no negative influence of any kind regarding the construction of other connected circuit parts. The production of the embodiment of the decoding circuit according to the invention, in which the decoder outputs have the first logic level H in the selected state and the second logic level L in the unselected state (as compared to the decoders according to the state of the art), is within the scope of the expertise of one of ordinary skill in the art.

We claim:

1. Decoding circuit in CMOS technology for decoding information represented by input signals, comprising:
    (a) first (VCC) and second (VSS) supply potential sources, an input for an individual input signal (A0), four further inputs for first and second input signals (A1, An) and input signals ($\overline{A1}$, $\overline{An}$) complementary thereto in pairs but not complementary to said individual input signal (A0), four decoder outputs (DA1 to DA4), two first connecting points (C,$\overline{C}$), and a last connecting point (A);
    (b) first, second, third and fourth CMOS inverters (I1 to I4) each having: an output connected to a respective one of said decoder outputs (DA1 to DA4), a transistor of one channel type having a source, a drain and a gate, and a transistor of the other channel type having a source, a drain and a gate;
    (c) the sources of said transistors of the one channel type in each CMOS inverter (I1 to I4) being connected to said first supply potential source (VCC);
    (d) the sources of the transistors of the other channel type in said first and second CMOS inverters (I1,I2) being connected to each other and to one of said first connecting points (C) and the sources of the transistors of the other channel type in said third and fourth CMOS inverters (I3,I4) being connected to each other and to the other of said first connecting points ($\overline{C}$);
    (e) two first switching transistors (T1, $\overline{T1}$) of the other channel type each having a drain connected to a respective one of said first connecting points (C, $\overline{C}$), a source connected to each other and to said last connecting point (A), and a gate;
    (f) the gate of one (T1) of said two first switching transistors (T1, $\overline{T1}$) being connected to said input for said second input signal (A1) of said four further input signals (A1, An, $\overline{A1}$, $\overline{An}$) complementary to each other in pairs and the gate of the other ($\overline{T1}$) of said two first switching transistors (T1, $\overline{T1}$) being connected to said input for said input signal ($\overline{A1}$) complementary to said second input signal (A1) of said four further input signals (A1, An, $\overline{A1}$, $\overline{An}$) complementary to each other in pairs;
    (g) a last switching transistor (T0) of the other channel type having a drain connected to said last connecting point (A), a source connected to said second supply potential source (VSS) and a gate connected to said input for said individual input signal (A0);
    (h) the gates of both transistors of said first and third CMOS inverters (I1, I3) being connected to said input for said first input signal (An) of said four further input signals (A1, An, $\overline{A1}$, $\overline{An}$) mutually complementary in pairs and the gates of both transistors of said second and fourth CMOS inverters (I2, I4) being connected to said input for said input signal ($\overline{An}$) complementary to said first input signal (An) of said four further input signals (A1, An, $\overline{A1}$, $\overline{An}$) mutually complementary in pairs: and (i) further complementary transistors (M0, M1, $\overline{M1}$) of the one channel type each having a drain connected to a respective one of said connecting points (A, C, $\overline{C}$), a source connected to said first supply potential source (VCC) and a gate connected to the gate of said switching transistor (T0, T1, $\overline{T1}$) having the drain thereof connected to said respective connecting point (A, C, $\overline{C}$) to which the drain of said respective complementary transistor (M0, M1, $\overline{M1}$) is connected.

2. Decoding circuit according to claim 1, wherein n is greater than 2, including:
(a) $2(n-2)$ further inputs for further input signals (A2) and input signals ($\overline{A2}$) complementary thereto in pairs, $2^{n-1}$ further decoder outputs (DA5 to DA8); further first connecting points making a total of $2^{n-1}$ first connecting points (C, D, $\overline{C}$, $\overline{D}$), $2^{n-1}$ second connecting points (B, $\overline{B}$), and $2^{n-3}$ further connecting points including a last further connecting point;
(b) $2^{n-1}$ further CMOS Inverters (I5 to I8) each having an output connected to a respective one of said further decoder outputs (DA5 to DA8), a transistor of one channel type having a source, a drain and a gate, and a transistor of the other channel type having a source, a drain and a gate;
(c) the source terminals of the transistors of the other channel type of two (I5, I6) of said further CMOS inverters (I5 to I8) being connected to each other and to one (D) of said further first connection points (C, D, $\overline{C}$, $\overline{D}$), the source terminals of the transistors of the other channel type of two others (I7, I8) of said further CMOS inverters (I5 to I8) being connected to each other and to another ($\overline{D}$) of said further first connection points (D): and said further CMOS inverters (I5 to I8) being otherwise connected like said first four CMOS inverters (I1 to I4);
(d) further first switching transistors (T2$_0$, T2$_1$, $\overline{T2_0}$, $\overline{T2_1}$) of the other channel type each having a drain connected to a respective one of said first connecting points (C, D, $\overline{C}$, $\overline{D}$) and a source connected together with the source of another of said further first switching transistors to one of said second connecting points (B, $\overline{B}$);
(e) second switching transistors (T1$_0$, $\overline{T1_0}$) of the other channel type each having a drain connected to a respective one of said second connecting points (B, $\overline{B}$) and a source connected to the source of another of said second switching transistors (T1$_0$, $\overline{T1_0}$) and to one of said further connecting points;
(f) said switching transistors forming an alignment with said sources of each two of said switching transistors being interconnected $n-1$ times, at the end of said alignment said last connecting point (A) being connected to said last of said further connecting points, and between said first connecting points (C, D, $\overline{C}$, $\overline{D}$) a total of $n-1$ switching stages being formed through said second connecting points (B, $\overline{B}$) and said further connecting points up to said last connecting point (A);
(g) the gate of one (T2$_0$; T2$_1$) of said two first switching transistors (T2$_0$, T2$_1$; $\overline{T2_0}$, $\overline{T2_1}$) being connected to said input for said first signal (A2) of said $2^{n-2}$ further input signals (A2, $\overline{A2}$) complementary to each other in pairs, and the gate of the other ($\overline{T2_0}$, $\overline{T2_1}$) of said two first switching transistors (T2$_0$, $\overline{T2_0}$; T2$_1$, $\overline{T2_1}$) being connected to said input for said input signal ($\overline{A2}$) complementary to said first signal of said $2(n-2)$ further input signals (A2, $\overline{A2}$) complementary to each other in pairs;
(h) in each switching stage with said further switching transistors, with the exception of said switching stage with said last switching transistor (T0), the gate of one of said two further switching transistors being connected to a further one of said inputs for said $2(n-2)$ further input signals (A2, $\overline{A2}$) complementary to each other in pairs, and the gate of the other of said two further switching transistors being connected to an input for an input signal further to said further $2(n-2)$ input signals (A2-,A2) complementary to each other in pairs: and
(i) additional complementary transistor (M2$_0$, M2$_1$, $\overline{M2_0}$, $\overline{M2_1}$, M1$_0$, $\overline{M1_1}$, of the one channel type each having a drain connected to a respective one of said first connecting points (C, D, $\overline{C}$, $\overline{D}$), said second connecting points (B, $\overline{B}$) and said further connecting points, a source connected to said first supply potential source (VCC) and a gate connected to the gate of said switching transistor (T2$_0$, T2$_1$, $\overline{T2_0}$, $\overline{T2_1}$, T1$_0$, $\overline{T1_0}$) having the drain thereof connected with said respective connecting point (C, D, /, $\overline{D}$, B, $\overline{B}$) to which the drain of said complementary transistor (M2$_0$, M2$_1$, $\overline{M2_0}$, $\overline{M2_1}$, M1$_0$, $\overline{M1_0}$) is connected.

3. Decoding circuit according to claim 1, wherein said transistors of the one channel type are p-channel transistors, said the transistors of the other channel type are n-channel transistors, and the first supply potential from said first supply potential source (VCC) is a potential more positive than the second supply potential from said second supply potential source (VSS).

4. Decoding circuit according to claim 1, wherein said transistors of the one channel type are n-channel transistors, said transistors of the other channel type are p-channel transistors, and the first supply potential from said first supply potential source (VCC) is a potential more negative than the second supply potential from said second supply potential source (VSS).

5. Decoding circuit according to claim 1, wherein said transistors are of the enhancement type.

6. Decoding circuit according to claim 1, wherein said input signals (A1, A2, An) of said further input signals (A1, A2, An, $\overline{A1}$, $\overline{A2}$, $\overline{An}$) as well as said individual input signals (A0) have a potential value substantially equal to the second supply potential from said second supply potential source (VSS) in an inactive state (until t1), and said input signals ($\overline{A1}$, $\overline{A2}$, $\overline{An}$) of said further input signals (A1, A2, An, $\overline{A1}$, $\overline{A2}$, $\overline{An}$) complementary to said last-mentioned input signals (A1, A2, An) of said further input signals (A1, A2, An, $\overline{A1}$, $\overline{A2}$, $\overline{A3}$) have a potential value substantially equal to the first supply potential from said first supply potential source (VCC) in an inactive state (until t1).

7. Decoding circuit according to claim 1, wherein said input signals (A1, A2, An) of said further input signals (A1, A2, An, $\overline{A1}$, $\overline{A2}$, $\overline{An}$) as well as said individual input signals (A0) have a potential value substantially equal to the first supply potential from said first supply potential source (VCC) in an inactive state (until t1), and said input signals ($\overline{A1}$, $\overline{A2}$, $\overline{An}$) of said further input signals (A1, A2, An, $\overline{A1}$, $\overline{A2}$, $\overline{An}$) complementary to said last-mentioned input signals (A1, A2, An) of said further input signals (A1, A2, An, $\overline{A1}$, $\overline{A2}$, $\overline{An}$) have a potential value substantially equal to the second supply potential from said second supply potential source (VSS) in an inactive state (until t1).

* * * * *